(12) United States Patent
Hori

(10) Patent No.: US 9,548,880 B2
(45) Date of Patent: Jan. 17, 2017

(54) TRANSMITTER AND ITS CONTROL METHOD

(71) Applicant: NEC CORPORATION, Tokyo (JP)

(72) Inventor: Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/022,802

(22) PCT Filed: Apr. 17, 2014

(86) PCT No.: PCT/JP2014/002174
§ 371 (c)(1),
(2) Date: Mar. 17, 2016

(87) PCT Pub. No.: WO2015/040773
PCT Pub. Date: Mar. 26, 2015

(65) Prior Publication Data
US 2016/0204970 A1 Jul. 14, 2016

(30) Foreign Application Priority Data
Sep. 18, 2013 (JP) .................... 2013-193075

(51) Int. Cl.
H04L 27/36 (2006.01)
H04L 27/34 (2006.01)
(Continued)

(52) U.S. Cl.
CPC ......... *H04L 27/3405* (2013.01); *H03F 1/0294* (2013.01); *H03F 1/32* (2013.01);
(Continued)

(58) Field of Classification Search
CPC ............. H03F 2200/331; H03F 3/217; H03F 2200/336; H03F 1/3282; H03C 3/40; H04L 27/361; H04L 27/362; H04L 27/34; H04L 25/03834; H04L 27/18; H04B 1/0039; H03M 3/30; H03M 3/40; H03M 3/50
(Continued)

(56) References Cited

U.S. PATENT DOCUMENTS

| 2007/0160164 A1 | 7/2007 | Sahota |
| 2007/0254622 A1 | 11/2007 | Matsuura et al. |
| 2013/0016795 A1* | 1/2013 | Kunihiro ............... H03F 1/0288 375/295 |

FOREIGN PATENT DOCUMENTS

| JP | 2007-300400 A | 11/2007 |
| JP | 2009-516963 A | 4/2009 |

(Continued)

OTHER PUBLICATIONS

Shinichi Hori, et al., "A 0.7-3GHz Envelope ΔΣ Modulator Using Phase Modulated Carrier Clock for Multi-mode/band Switching Amplifiers", IEEE Radio Frequency Integrated Circuits Symposium Digest, Jun. 2011, pp. 35-38.
(Continued)

*Primary Examiner* — Rahel Guarino
(74) *Attorney, Agent, or Firm* — Sughrue Mion, PLLC

(57) ABSTRACT

According to an embodiment, a digital transmitter (1) includes an amplitude modulation amplitude signal generation unit (132) that generates a function f(A(t)) of an amplitude signal A(t) as an amplitude modulation amplitude signal A'(t), an amplitude modulation phase signal generation unit (133) that calculates "$\cos^{-1} \{A(t)/f(A(t))\}$" as a phase θ1($t$) and generates amplitude modulation phase signals P1($t$) and P2($t$), an individual digital transmission unit (11) that generates an amplified RF-pulse signal based on the signals A'(t) and P1($t$), an individual digital transmission unit (12) that generates an amplified RF-pulse signal based on the signals A'(t) and P2($t$), and an RF-synthesizer (16)
(Continued)

that combines outputs of the individual digital transmission units (11, 12) with each other.

10 Claims, 13 Drawing Sheets

(51) Int. Cl.
*H03F 1/02* (2006.01)
*H04B 1/04* (2006.01)
*H03F 1/32* (2006.01)
*H03F 3/217* (2006.01)

(52) U.S. Cl.
CPC ............... *H03F 3/217* (2013.01); *H04B 1/04* (2013.01); *H04L 27/365* (2013.01)

(58) Field of Classification Search
USPC ....... 375/297, 298, 300, 261; 330/10, 124 R, 330/251; 332/120, 144, 145; 708/276
See application file for complete search history.

(56) References Cited

FOREIGN PATENT DOCUMENTS

JP   WO2013/042754 A1   3/2013
WO      2011/078120 A1   6/2011

OTHER PUBLICATIONS

International Search Report of PCT/JP2014/002174, dated Jul. 15, 2014. [PCT/ISA/210].

\* cited by examiner

Related Art

TRANSMITTER AND ITS CONTROL METHOD

CROSS REFERENCE TO RELATED APPLICATIONS

This application is a National Stage of International Application No. PCT/JP2014/002174 filed Apr. 17, 2014, claiming priority based on Japanese Patent Application No. 2013-193075, filed Sep. 18, 2013, the contents of all of which are incorporated herein by reference in their entirety.

TECHNICAL FIELD

The present invention relates to a transmitter and its control method.

BACKGROUND ART

The transmission unit of a mobile phone, a wireless LAN (Local Area Network) communication device, or the like is required to operate with lower power consumption while ensuring the accuracy of transmission signals irrespective of the magnitude of its output power. In particular, a power amplifier circuit disposed in the last stage of the transmission unit of a communication device is required to have high power efficiency because it consumes at least 50% of the overall power consumption of the communication device.

Recently, switching amplifier circuits are receiving attention as power amplifier circuits that are expected to have high power efficiency. The switching amplifier circuit operates on the assumption that an input signal is a signal having a pulse waveform, and amplifies power while maintaining the waveform. After frequency components other than a desired frequency component are suppressed by a filter element, the pulse-waveform signal amplified by the switching amplifier circuit is emitted in the air from an antenna.

Each of Patent Literature 1 and Non-patent Literature 1 discloses a configuration of a transmitter including a D-class amplifier circuit, which is a type of switching amplifier circuit. This transmitter reproduces an RF-radio signal by amplifying an RF-pulse signal generated by a RF-signal generator by using a driver amplifier and the D-class amplifier circuit and removing unnecessary components of the amplified RF-pulse signal by using a filter disposed behind the D-class amplifier circuit.

CITATION LIST

Patent Literature

Patent Literature 1: International Patent Publication No. WO2011/078120

Non Patent Literature

Non-patent Literature 1: S. Hori, K. Kunihiro, K. Takahashi and M. Fukaishi, "A 0.7-3 GHz envelope delta-sigma modulator using phase modulated carrier clock for multimode/band switching amplifiers", IEEE Radio Frequency Integrated Circuits Symposium Digest, pp. 35-38, June 2011

SUMMARY OF INVENTION

Technical Problem

Incidentally, an ACLR (Adjacent Channel Leakage Ratio) is one of the items specified in the current carrier standards. This item requires that power that leaks from a channel occupied by a desired signal to a neighboring channel be reduced to or below a specified value. For example, the ACLR in the LTE (Long Term Evolution) standards for base stations needs to be 45 dB or larger in the case of an offset of 20 MHz.

Note that the RF-pulse signal, which is generated by the RF-signal generator disposed in the transmitter according to the related art, contains quantization noises in addition to the desired signal. The transmitter according to the related art suppresses the quantization noises outside the pass band by using the filter disposed behind the D-class amplifier circuit. However, neighboring channels are usually present within the band of the filter. Therefore, the quantization noise that escapes (or leaks) to the neighboring channel cannot be removed by the filter. Accordingly, it is necessary to satisfy the condition for the ACLR by suppressing the quantization noise in the output of the D-class amplifier circuit disposed in front of the filter or at least in the output of the RF-signal generator. However, there has been a problem in the transmitter according to the related art that since the quantization noise cannot be sufficiently suppressed, it is impossible to satisfy the condition for the ACLR in the LTE standards for base stations. Other problems to be solved by and novel features of the present invention will become more apparent from the following descriptions of the specification and the accompanying drawings of the present invention.

The present invention has been made to solve the above-described problem and an object thereof is to provide a transmitter and its control method capable of reducing the quantization noise and thereby satisfying the condition for the ACLR.

Solution to Problem

According to an exemplary embodiment, a radio device includes: a quadrature converter that performs a quadrature modulation on a digital signal and thereby outputs a quadrature radio signal; an amplitude modulation amplitude signal generation unit that generates a first predetermined function of an amplitude signal indicating an amplitude of the quadrature radio signal as an amplitude modulation amplitude signal; an amplitude modulation phase signal generation unit that calculates an inverse trigonometric function of a value according to the first predetermined function as a first phase and generates first and second amplitude modulation phase signals having phases shifted on positive and negative sides, respectively, by an amount corresponding to the first phase from a phase signal indicating a phase of the quadrature radio signal; a first pulse phase signal generator that generates a first pulse phase signal having a pulse waveform based on the first amplitude modulation phase signal; a first ΔΣ-modulator that performs a ΔΣ-modulation on the amplitude modulation amplitude signal in synchronization with the first pulse phase signal; a first mixer that generates a first RF-pulse signal by mixing an output signal of the first ΔΣ-modulator with the first pulse phase signal; a first switching amplifier that amplifies the first RF-pulse signal; a second pulse phase signal generator that generates a second pulse phase signal having a pulse waveform based on the second amplitude modulation phase signal; a second ΔΣ-modulator that performs a ΔΣ-modulation on the amplitude modulation amplitude signal in synchronization with the second pulse phase signal; a second mixer that generates a second RF-pulse signal by mixing an output signal of the second ΔΣ-modulator with the second pulse phase signal; a second switching amplifier that amplifies the second RF-pulse signal; and a synthesizer that combines outputs of the first and second switching amplifiers with each other.

Further, according to an exemplary embodiment, a control method for a radio device includes: performing a quadrature modulation on a digital signal and thereby outputting a quadrature radio signal; generating a first predetermined function of an amplitude signal indicating an amplitude of the quadrature radio signal as an amplitude modulation amplitude signal; calculating an inverse trigonometric function of a value according to the first predetermined function as a first phase and generating first and second amplitude modulation phase signals having phases shifted on positive and negative sides, respectively, by an amount corresponding to the first phase from a phase signal indicating a phase of the quadrature radio signal; generating a first pulse phase signal having a pulse waveform based on the first amplitude modulation phase signal; performing a ΔΣ-modulation on the amplitude modulation amplitude signal in synchronization with the first pulse phase signal; generating a first RF-pulse signal by mixing a result of the ΔΣ-modulation with the first pulse phase signal; amplifying the first RF-pulse signal by a first switching amplifier; generating a second pulse phase signal having a pulse waveform based on the second amplitude modulation phase signal; performing a ΔΣ-modulation on the amplitude modulation amplitude signal in synchronization with the second pulse phase signal; generating a second RF-pulse signal by mixing a result of the ΔΣ-modulation with the second pulse phase signal; amplifying the second RF-pulse signal by a second switching amplifier; and combining outputs of the first and second switching amplifiers with each other.

Advantageous Effects of Invention

According to the above-described embodiment, it is possible to provide a transmitter and its control method capable of reducing the quantization noise and thereby satisfying the condition for the ACLR.

DESCRIPTION OF EMBODIMENTS

Examination by Inventor

Prior to the explanation of a transmitter according to the present invention, examinations on a transmitter according to related art made by the inventor of the present application are explained.

Figure 11:
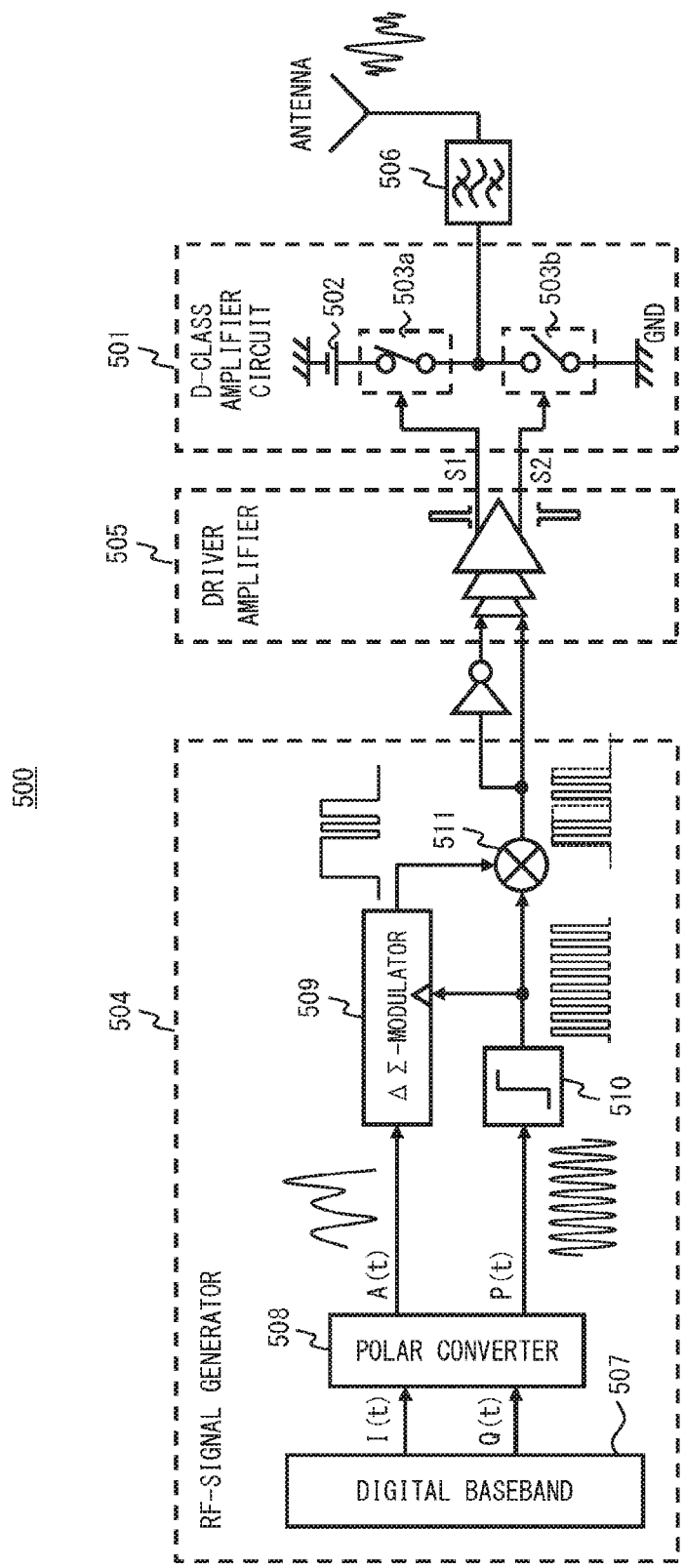
FIG. 11 is a block diagram showing a configuration example of a digital transmitter according to related art.

FIG. 11 is a block diagram showing a configuration example of a transmitter 500 according to related art. The transmitter 500 shown in FIG. 11 uses a D-class amplifier circuit, which is a typical example of the switching amplifier circuits that are expected to have high power efficiency. In the following explanation, a transmitter using a D-class amplifier circuit is also referred to as a "digital transmitter".

Figure 12:
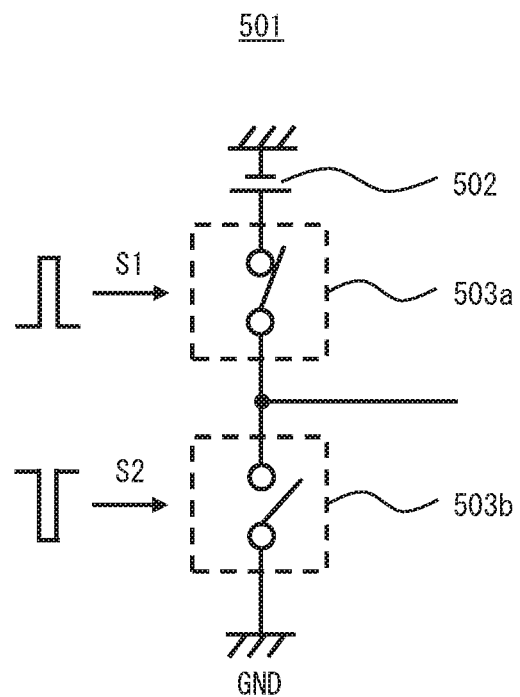
FIG. 12 is a circuit diagram showing a specific configuration example of a D-class amplifier circuit shown in FIG. 11.

FIG. 12 is a circuit diagram showing a specific configuration example of a D-class amplifier circuit 501. This D-class amplifier circuit 501 includes two switch elements 503a and 503b inserted in series between a power supply 502 and a ground GND. Complementary pulse signals S1 and S2 are input to the two switch elements 503a and 503b as open/close control signals and the two switch elements 503a and 503b are controlled so that only one of them becomes an on-state. For example, when the switch element 503a on the power supply 502 side is an on-state and the switch element 503b on the ground GND side is an off-state, a voltage equal to a power supply voltage is output from the D-class amplifier circuit 501. In the reversed case, a ground voltage is output from the D-class amplifier circuit 501.

This D-class amplifier circuit 501 requires no bias current. Therefore, the power loss is ideally zero. Each of the switch elements 503a and 503b is formed from, for example, a MOS (Metal-Oxide-Semiconductor) field-effect transistor, a bipolar transistor, or the like.

Referring to FIG. 11 again, the transmitter 500 includes a RF-signal generator 504, a driver amplifier 505, the D-class amplifier circuit 501, a filter 506, and so on. This transmitter 500 reproduces an RF-radio signal by amplifying an RF-pulse signal generated by the RF-signal generator 504 by using the filter 506 and the D-class amplifier circuit 501 and removing unnecessary components of the amplified RF-pulse signal by using the filter 506 disposed behind the D-class amplifier circuit 501.

The RF-signal generator 504 includes a digital baseband 507, a polar converter (amplitude/phase detector) 508, a ΔΣ-modulator 509, a comparator (pulse phase signal generator) 510, and a mixer 511, The polar converter 508 converts quadrature radio signals I(t) and Q(t) generated by the digital baseband 507 into an amplitude signal A(t) and a phase signal P(t) in accordance with the below-shown Expressions (1) and (2).

[Expression 1]

$$A(t) = \sqrt{I(t)^2 + Q(t)^2} \tag{1}$$

[Expression 2]

$$P(t) = \sin(\omega c \cdot t + \alpha) \tag{2}$$

Note that α is expressed by the below shown Expression (3).

[Expression 3]

$$\alpha = \tan^{-1}(I(t)/Q(t)) \tag{3}$$

Further, ωc is an angular frequency corresponding to a carrier frequency.

Note that as shown in the below-shown Expression (4), the product of the amplitude signal A(t) and the phase signal P(t) is a radio signal RF(t).

[Expression 4]

$$RF(t) = A(t) \cdot P(t) \tag{4}$$

The comparator 510 converts the phase signal P(t) having a sine-wave shape into a pulse signal having a rectangular shape by performing a comparison operation in which the threshold is zero. This pulse phase signal PR(t) is expressed by the below-shown Expression (5).

[Expression 5]

$$PR(t) = P(t) + H(t) \tag{5}$$

Note that H(t) is a harmonic component of the phase signal P(t) that occurs when the phase signal P(t) is converted into a rectangular shape.

Figure 13:
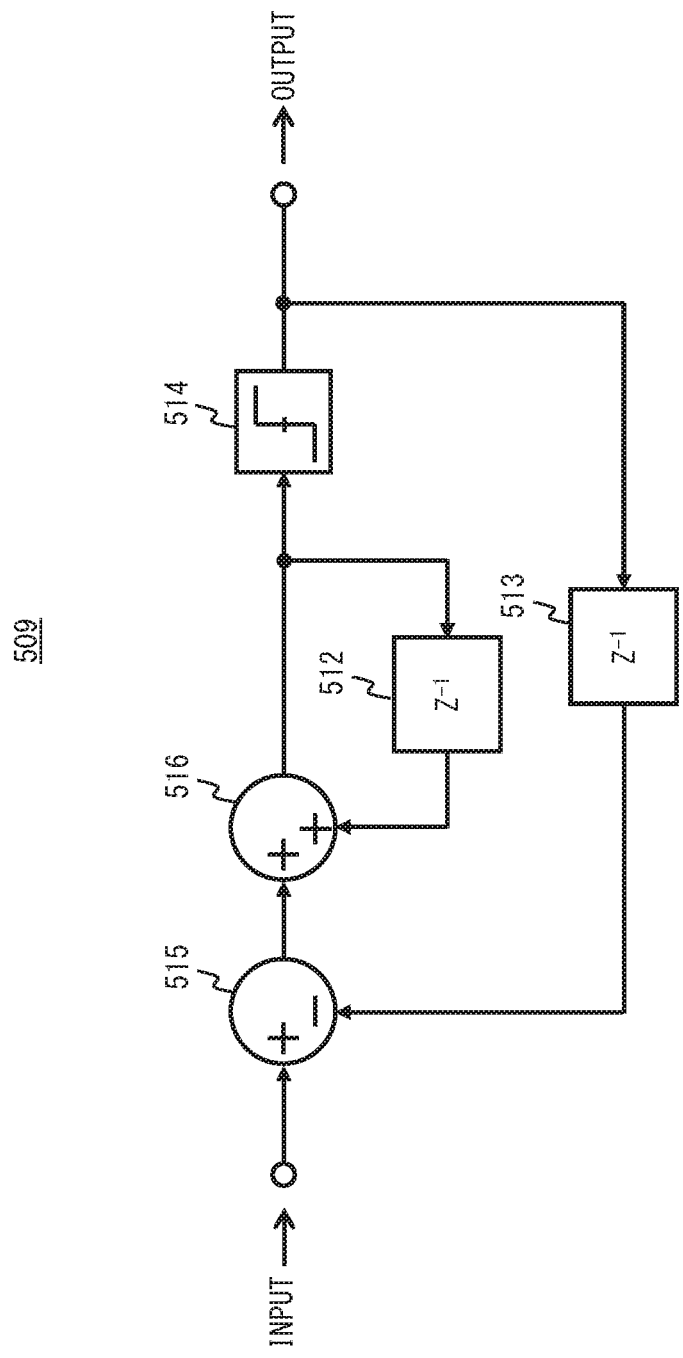
FIG. 13 shows a specific configuration example of a ΔΣ-modulator shown in FIG. 11.

The ΔΣ-modulator 509 operates in synchronization with an output signal of the comparator 510, which is supplied as a clock signal, and performs a ΔΣ-modulation on the amplitude signal A(t). FIG. 13 shows a specific configuration example of the ΔΣ-modulator 509. The ΔΣ-modulator 509 shown in FIG. 13 is a primary ΔΣ-modulator and includes delay devices 512 and 513, a quantizer 514, adder-subtracters 515 and 516. In this example, the quantizer 514 is a 1-bit comparator that outputs 1 or −1 according to whether an input signal is larger or smaller than a threshold. Letting Y(z) and W(z) stand for an input signal and an output signal, respectively, of this ΔΣ-modulator 509, and N(z) stand for a quantization noise occurring in the quantizer 514, the below-shown Expression (6) holds among these three values.

[Expression 6]

$$W(z) = Y(z) + (1 - z^{-1}) \cdot N(z) \tag{6}$$

Note that z is expressed as "z=e^j(2πf/fs)". Here, f is the frequency of the input signal. Further, fs is a clock rate (sampling frequency) of the clock signal for the ΔΣ-modulator 509.

The above-shown Expression (6) indicates that the output signal includes the input signal and a value obtained by multiplying the quantization noise by a coefficient "$(1-z^{-1})$". The absolute value of "$(1-z^{-1})$" becomes closer to zero when the frequency of the input signal is in a frequency range sufficiently smaller than the sampling frequency, and becomes two, which is the maximum value, when the frequency of the input signal is equal to the Nyquist frequency (half of the sampling frequency).

Note that the signal-to-quantization noise ratio of the output signal is expressed by a ratio between Y(z) and $(1-z^{-1}) \cdot N(z)$. Therefore, for example, the lower the frequency range of the frequency of the input signal becomes, the smaller the quantization noise becomes, thus making the quantization noise negligible. Therefore, the signal-to-quantization noise ratio becomes higher. On the other hand, when the frequency of the input signal is in a high frequency range, the signal-to-quantization noise ratio is low. That is, the ΔΣ-modulator 509 can suppress the mixing of the quantization noise into the signal band under the condition that the signal band width is sufficiently smaller than the sampling frequency. Letting A(z) stand for a value obtained by performing a Z-transformation on the amplitude signal A(t), the output signal of the ΔΣ-modulator is expressed by the below-shown Expression (7).

[Expression 7]

$$W(z) = A(z) + (1 - z^{-1}) \cdot N(z) \tag{7}$$

When the above-shown expression is rewritten in terms of the time domain, it is expressed as the below-shown Expression (8).

[Expression 8]

$$W(t)A(t) + NH(t) \tag{8}$$

Note that NH(t) is the sum of a component that represents the signal-to-quantization noise ratio component $(1-z^{-1}) \cdot N(z)$ expressed by the above-shown Expression (7) in the time domain and an image component of A(t) that occurs at a frequency equal to or higher than the Nyquist frequency when A(z) is expressed in the time domain.

The mixer 511 outputs the product of the output signals of the ΔΣ-modulator 509 and the comparator 510. The output signal (RF-pulse signal) MIX(t) of the mixer 511 is expressed by the below-shown Expression (9) based on the above-shown Expressions (5) and (8).

[Expression 9]

$$\text{MIX}(t) = A(t) \cdot P(t) + A(t) \cdot H(t) + P(t) \cdot NH(t) + NH(t) \cdot H(t) \tag{9}$$

The first term in the above-shown expression is the radio signal RF(t) shown by the above-shown Expression (4). This means that the RF-signal generator 504 can generates a pulse signal including the radio signal. By supplying this pulse signal to the D-class amplifier circuit 501 through the driver amplifier 505, the radio signal can be amplified to a desired level. Although the unnecessary components of the second and subsequent terms of the above-shown Expression (9) are also amplified, the components outside the band of the filter 506 disposed behind the D-class amplifier circuit 501 are removed by the filter 506.

Note that the pulse signal generated by the RF-signal generator 504 in the transmitter 500 shown in FIG. 11 contains quantization noises in addition to the desired signal. The transmitter 500 shown in FIG. 11 suppresses the quantization noises outside the pass band of the filter 506 disposed behind the D-class amplifier circuit 501 by the filter 506. However, neighboring channels are usually present within the band of the filter 506. Therefore, the quantization noise that leaks to the neighboring channels cannot be removed by the filter 506. Accordingly, it is necessary to suppress the quantization noise in the output of the D-class above-shown 501 disposed in front of the filter 506 or at least in the output of the RF-signal generator 504 to satisfy the condition for the ACLR. However, there has been a problem in the digital transmitter 500 shown in FIG. 11 that since the quantization noise cannot be sufficiently suppressed, it is impossible to satisfy the condition for the ACLR in the LTE standards for base stations.

Although the present invention is explained hereinafter through exemplary embodiments according to the present invention, those exemplary embodiments are not shown to limit the invention according to the claims. Further, all the combinations of features explained in the exemplary embodiments are not necessarily indispensable to the means for solving the problems of the invention.

First Exemplary Embodiment

Figure 1:
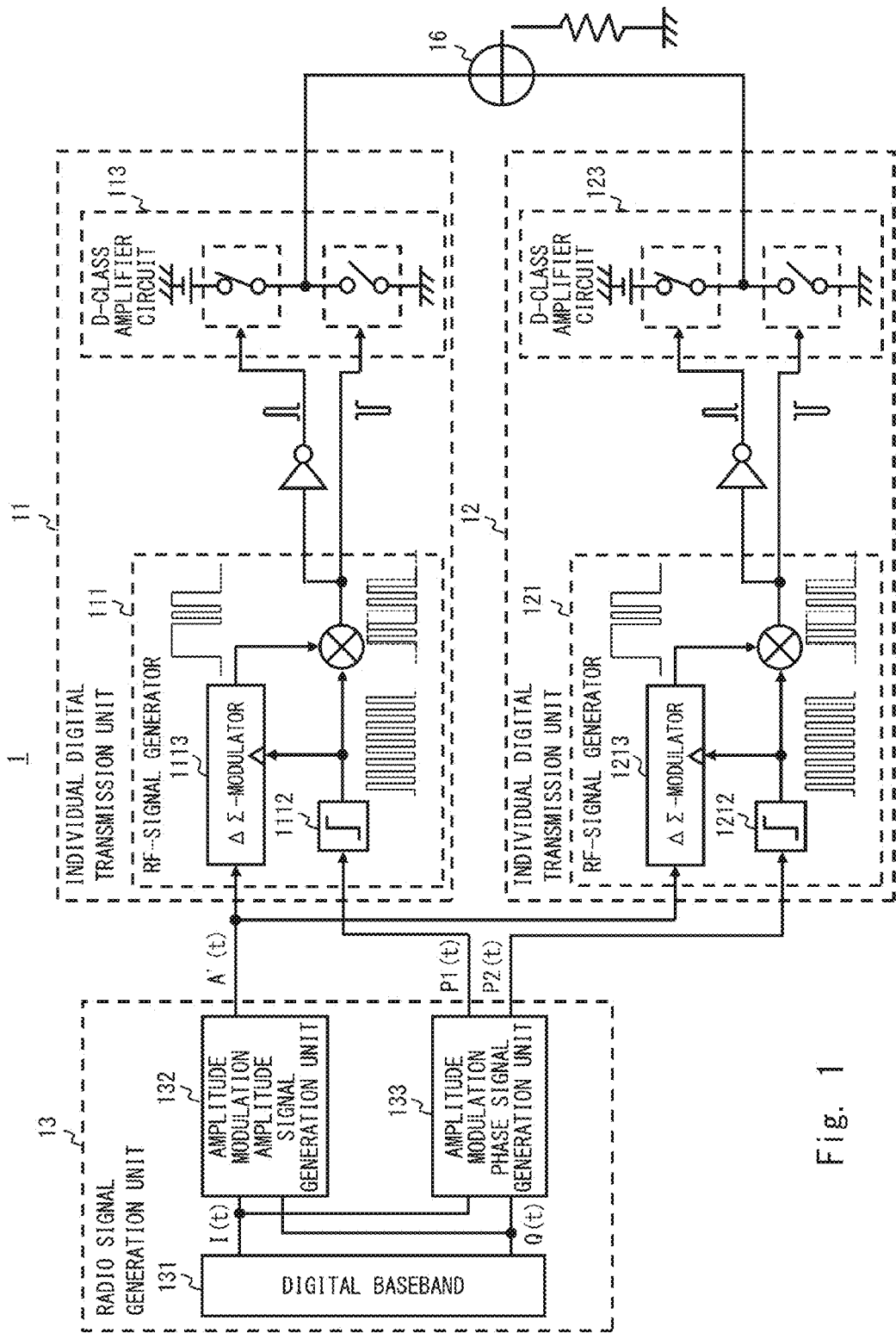
FIG. 1 is a block diagram showing a configuration example of a digital transmitter according to a first exemplary embodiment.

FIG. 1 is a block diagram showing a configuration example of a digital transmitter (transmitter) according to a first exemplary embodiment. A digital transmitter 1 shown in FIG. 1 includes two individual digital transmission units 11 and 12, a radio signal generation unit 13, and an RF-synthesizer (synthesizer) 16. The individual digital transmission unit 11 includes an RF-signal generator 111 and a D-class amplifier circuit (first switching amplifier) 113. The individual digital transmission unit 12 includes an RF-signal generator 121 and a D-class amplifier circuit (second switching amplifier) 123.

Figure 2:
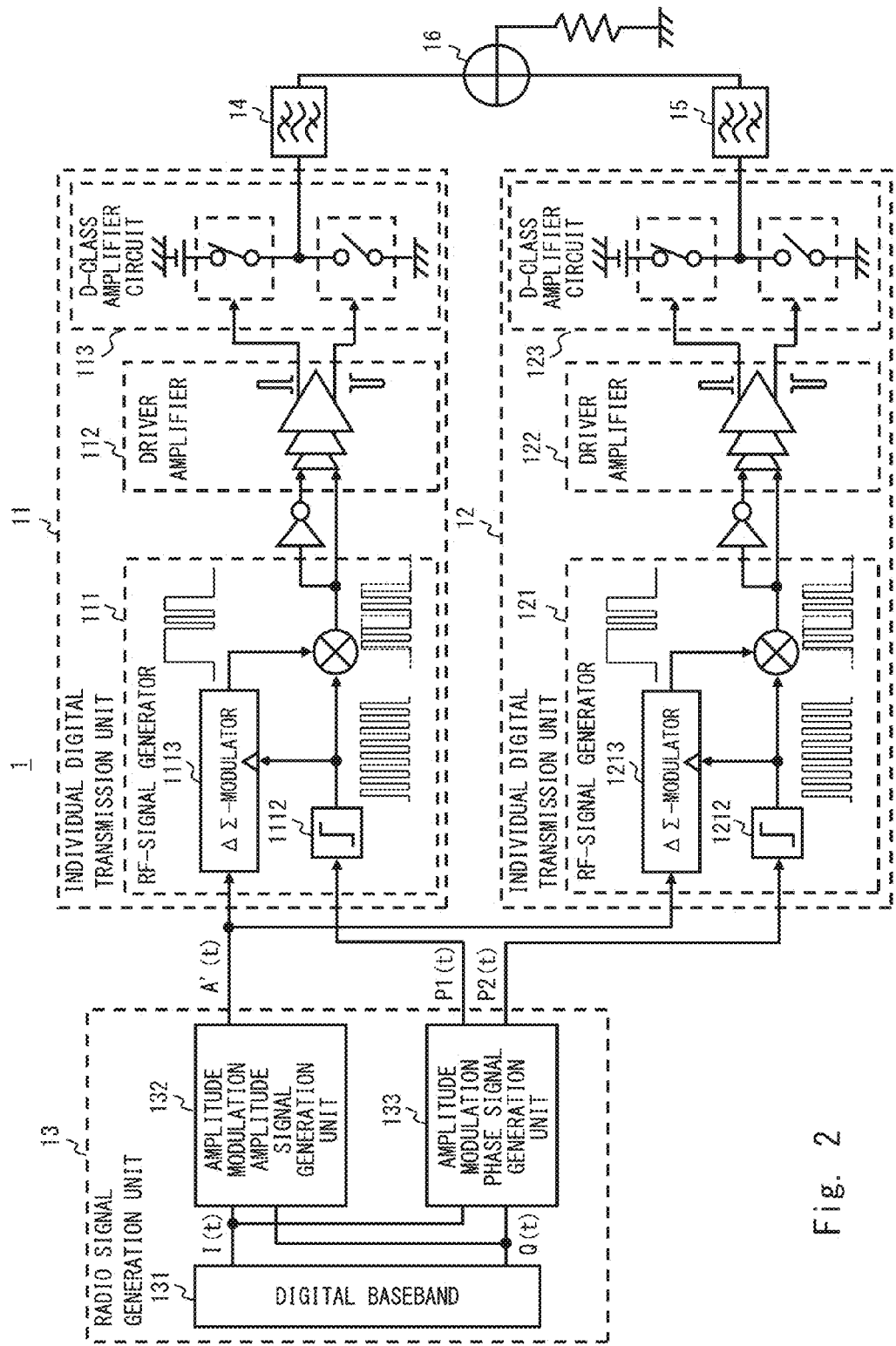
FIG. 2 is a block diagram showing a specific configuration example of a digital transmitter according to the first exemplary embodiment.

FIG. 2 is a block diagram showing the configuration example of the digital transmitter 1 shown in FIG. 1 in a more detailed manner. The digital transmitter 1 shown in FIG. 2 further includes filters (band-pass filters) 14 and 15, a driver amplifier 112 disposed in the individual digital transmission unit 11, and a driver amplifier 122 disposed in the individual digital transmission unit 12. Each of the driver amplifiers 112 and 122 drives an input signal and outputs the driven signal, and thus it is preferred that these components be provided. Each of the filters 14 and 15 allows only a signal component in a predetermined band to pass therethrough, and thus it is preferred that these components be provided. The following explanation is given with reference to the digital transmitter 1 shown in FIG. 2.

Note that the RF-signal generator 111, the driver amplifier 112, and the D-class amplifier 113 disposed in the individual digital transmission unit 11 correspond to the parts (509, 510 and 511) of the RF-signal generator 504, the driver amplifier 505, and the D-class amplifier circuit 501, respectively, disposed in the transmitter 500 shown in FIG. 11, and have configurations identical to those of these components. Further, the RF-signal generator 121, the driver amplifier 122, and the D-class amplifier 123 disposed in the individual digital transmission unit 12 correspond to the parts (509, 510 and 511) of the RF-signal generator 504, the driver amplifier 505, and the D-class amplifier circuit 501, respectively, disposed in the transmitter 500 shown in FIG. 11, and have configurations identical to those of these components.

The radio signal generation unit 13 includes a digital baseband (quadrature converter) 131, an amplitude modulation amplitude signal generation unit 132, and an amplitude modulation phase signal generation unit 133. The amplitude modulation amplitude signal generation unit 132 generates an amplitude modulation amplitude signal that is obtained by processing an amplitude signal according to the value of the amplitude signal. The amplitude modulation phase signal generation unit 133 generates an amplitude modulation phase signal that is obtained by processing a phase signal according to the value of the phase signal. Detailed explanations of them are given hereinafter.

The digital baseband 131 generates quadrature radio signals I(t) and Q(t) by performing a quadrature modulation on a digital signal.

The amplitude modulation amplitude signal generation unit 132 outputs a function (first predetermined function) of an amplitude signal A(t) calculated from the quadrature radio signals I(t) and Q(t) based on Expression (1) as an amplitude modulation amplitude signal A'(t). Specifically, the amplitude modulation amplitude signal A'(t) is expressed by the below-shown Expression (10).

[Expression 10]

$$A'(t)=f(A(t)) \qquad (10)$$

The amplitude modulation phase signal generation unit 133 outputs a function of a phase signal P(t) calculated from the quadrature radio signals I(t) and Q(t) based on Expressions (2) and (3) and the above-described amplitude signal A(t) as amplitude modulation phase signals P1(*t*) and P2(*t*). Specifically, the amplitude modulation phase signals P1(*t*) and P2(*t*) are expressed as the below-shown Expressions (11) and (12), respectively.

[Expression 11]

$$P1(t)=(\cos^{-1}(P(t))+\theta1(t) \qquad (11)$$

$$\theta1(t)=\cos^{-1}(A(t)/f(A(t)))$$

[Expression 12]

$$P2(t)=\cos(\cos^{-1}(P(t))-\theta1(t)) \qquad (12))$$

Note that θ1(*t*) is referred to as a "phase difference signal (first phase)" hereinafter.

The amplitude modulation amplitude signal A'(t) generated by the amplitude modulation amplitude signal generation unit 132 and the amplitude modulation phase signal P1(*t*) generated by the amplitude modulation phase signal generation unit 133 are input to the individual digital transmission unit 11. More specifically, the amplitude modulation amplitude signal A'(t) is input to a ΔΣ-modulator (first ΔΣ-modulator) 1111 disposed in the RF-signal generator 111 of the individual digital transmission unit 11, and the amplitude modulation phase signal P1(*t*) is input to a comparator (first pulse phase signal generator) 1112 disposed in the RF-signal generator 111 of the individual digital transmission unit 11.

Note that the configuration of the individual digital transmission unit 11 is identical to that of the polar converter 508 and the components behind the polar converter 508 in the transmitter 500 shown in FIG. 11. Therefore, the output signal D1(*t*) of the individual digital transmission unit 11 is equivalent to the output signal of the transmitter 500 on the condition that the amplitude modulation amplitude signal A'(t) is used as the amplitude signal A(t) and the phase signal P1(*t*) is used as the phase signal P(t). Accordingly, the output signal D1(*t*) of the individual digital transmission unit 11 can be expressed by the below-shown Expression (13) based on Expression (9).

[Expression 13]

$$D1(t)=A'(t)\cdot P1(t)+A'(t)\cdot H1(t)+P1(t)\cdot NH1(t)+NH1(t)\cdot H1(t) \qquad (13)$$

Note that H1(*t*) is a harmonic component that occurs when the amplitude modulation phase signal P1(*t*) is converted into a rectangular shape by the comparator 1112 of the individual digital transmission unit 11. Further, NH1(*t*) is the sum of a quantization noise occurring in the ΔΣ-modulator 1111 of the individual digital transmission unit 11 and an image component of the amplitude modulation amplitude signal A'(t).

Meanwhile, the amplitude modulation amplitude signal A'(t) generated by the amplitude modulation amplitude signal generation unit 132 and the amplitude modulation phase signal P2(*t*) generated by the amplitude modulation phase signal generation unit 133 are input to the individual digital transmission unit 12. More specifically, the amplitude modulation amplitude signal A'(t) is input to a ΔΣ-modulator (first ΔΣ-modulator) 1211 disposed in the RF-signal generator 121 of the individual digital transmission unit 12, and the amplitude modulation phase signal P2(*t*) is input to a comparator (first pulse phase signal generator) 1212 disposed in the RF-signal generator 121 of the individual digital transmission unit 12.

Similarly to the output signal D1(*t*) of the individual digital transmission unit 11, the output signal D2(*t*) of the individual digital transmission unit 12 can be expressed by the below-shown Expression (14) based on Expression (9).

[Expression 14]

$$D2(t)=A'(t)\cdot P2(t)+A'(t)\cdot H2(t)+P2(t)\cdot NH2(t)+NH2(t)\cdot H2(t) \quad (14)$$

Note that H2(*t*) is a harmonic component that occurs when the amplitude modulation phase signal P2(*t*) is converted into a rectangular shape by the comparator 1212 of the individual digital transmission unit 12. Further, NH2(*t*) is the sum of a quantization noise occurring in the ΔΣ-modulator 1211 of the individual digital transmission unit 12 and an image component of the amplitude modulation amplitude signal A'(t).

An RF-synthesizer 16 combines the output signals D1(*t*) and D2(*t*) of the individual digital transmission units 11 and 12 supplied through the filters 14 and 15 and thereby generates an output signal Dout(t), which is the output signal of the digital transmitter 1. Specifically, the output signal Dout(t) is expressed by the below-shown Expression (15).

[Expression 15]

$$Dout(t)=D1(t)+D2(t) \quad (15)$$

The output signal Dout(t) can be rewritten as the below-shown Expression (16) based on Expressions (13), (14) and (15).

[Expression 16]

$$Dout(t) = DRF(t) + A'(t)\cdot(H1(t) + H2(t)) + P1(t)\cdot NH1(t) + P2(t)\cdot NH2(t) + NH1(t)\cdot H1(t) + NH2(t)\cdot H2(t) \quad (16)$$

Note that DRF(t) is expressed by the below-shown Expression (17).

[Expression 17]

$$DRF(t)=A'(t)\cdot(P1(t)+P2(t)) \quad (17)$$

DRF(t) can be can be rewritten as the below-shown Expression (18) based on Expressions (10), (11), (12) and (17).

[Expression 18]

$$DRF(t)=2\cdot A(t)\cdot P(t) \quad (18)$$

Expression (18) indicates that DRF(t) is a signal that is obtained by scaling up a desired radio signal RF(t) by a factor of two.

It can be understood from Expressions (16) and (18) that the output signal Dout(t) of the digital transmitter 1 contains the component of the desired radio signal. Note that the signal components other than DRF(t) contained in the output signal Dout(t) of the digital transmitter 1 are sufficiently suppressed by the filters 14 and 15. As a result, the output signal Dout(t) becomes approximately equal to DRF(t). Note that although the filters 14 and 15 are provided on the output sides of the respective individual digital transmission units 11 and 12 in this example, the present invention is not limited to such a configuration. That is, a filter(s) may be provided on the output side of the RF-synthesizer 16.

Next, effects of the digital transmitter 1 according to this exemplary embodiment in a case where the function f(A(t)) between the amplitude signal A(t) and the amplitude modulation amplitude signal A'(t) shown by Expression (10) is defined in a specific manner are explained.

<First Specific Example of Function f(A(t))>

Firstly, the effect of the digital transmitter 1 according to this exemplary embodiment in a case where a function 1 is used as a first specific example of the function f(A(t)) is explained. The function 1 is expressed by the below-shown Expression (19).

[Expression 19]

$$f(A(t)) = A(t) \text{ if } A(t) \geq a\cdot A\max = a\cdot A\max \text{ if } A(t) < a\cdot A\max \quad (19)$$

Note that Amax is the possible maximum value of the amplitude signal A(t) and a is an arbitrary constant between 0 and 1.

Then, the amplitude modulation amplitude signal A'(t) and the phase difference signal θ1(*t*) are expressed by the below-shown Expression (20) or (21) depending on the case.

[Expression 20]

When $A(t) \geq a\cdot A$ max, $$A'(t)=A(t)$$

$$\theta 1(t)=0 \quad (20)$$

[Expression 21]

When $A(t) < a\cdot A$ max, $$A'(t)=a\cdot A \text{ max}$$

$$\theta 1(t)=\cos^{-1}(A(t)/(a\cdot A \text{ max})) \quad (21)$$

Figure 3A:
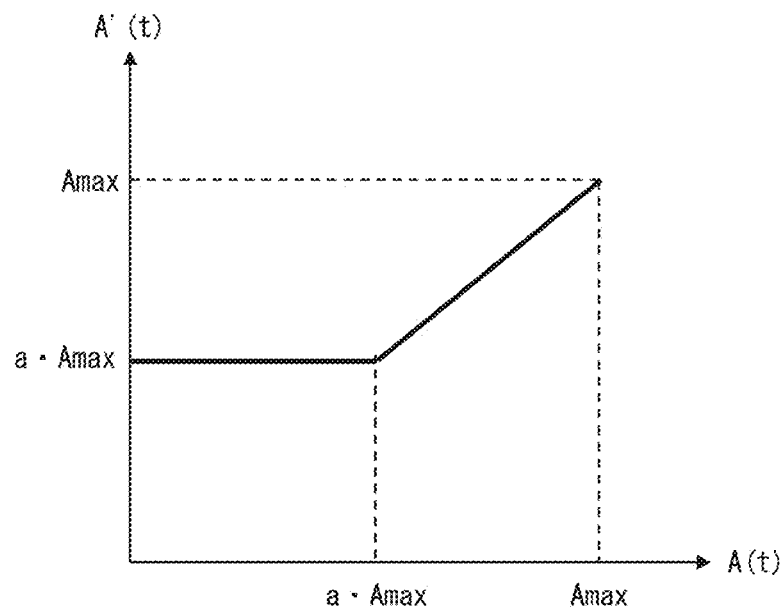
FIG. 3A shows a relation between an amplitude signal A(t) and an amplitude modulation amplitude signal A'(t)
Figure 3B:
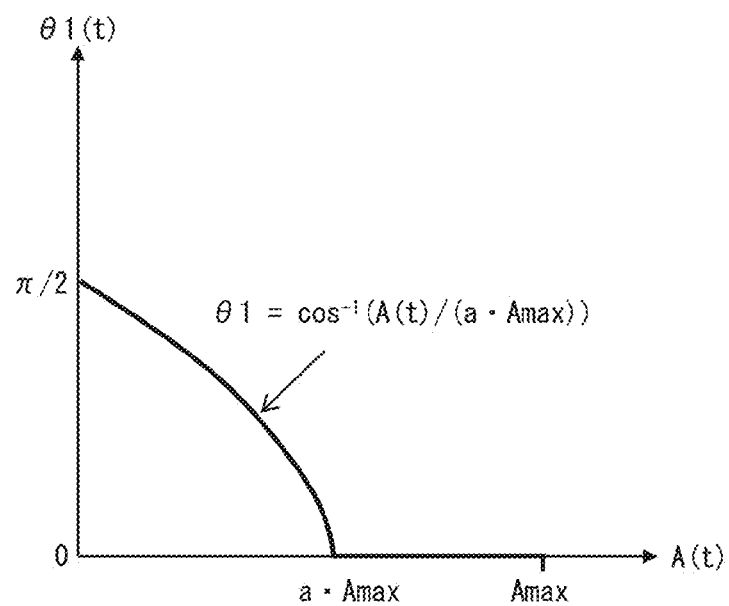
FIG. 3B shows a relation between an amplitude signal A(t) and a phase difference signal θ1(t)

The relations among the amplitude signal A(t), the amplitude modulation amplitude signal A'(t), and the phase difference signal θ1(*t*) are expressed as shown in FIGS. 3A and 3B based on Expressions (20) and (21). FIG. 3A is a graph showing a relation between the amplitude signal A(t) and the amplitude modulation amplitude signal A'(t). FIG. 3B is a graph showing a relation between the amplitude signal A(t) and the phase difference signal θ1(*t*).

Figure 4:
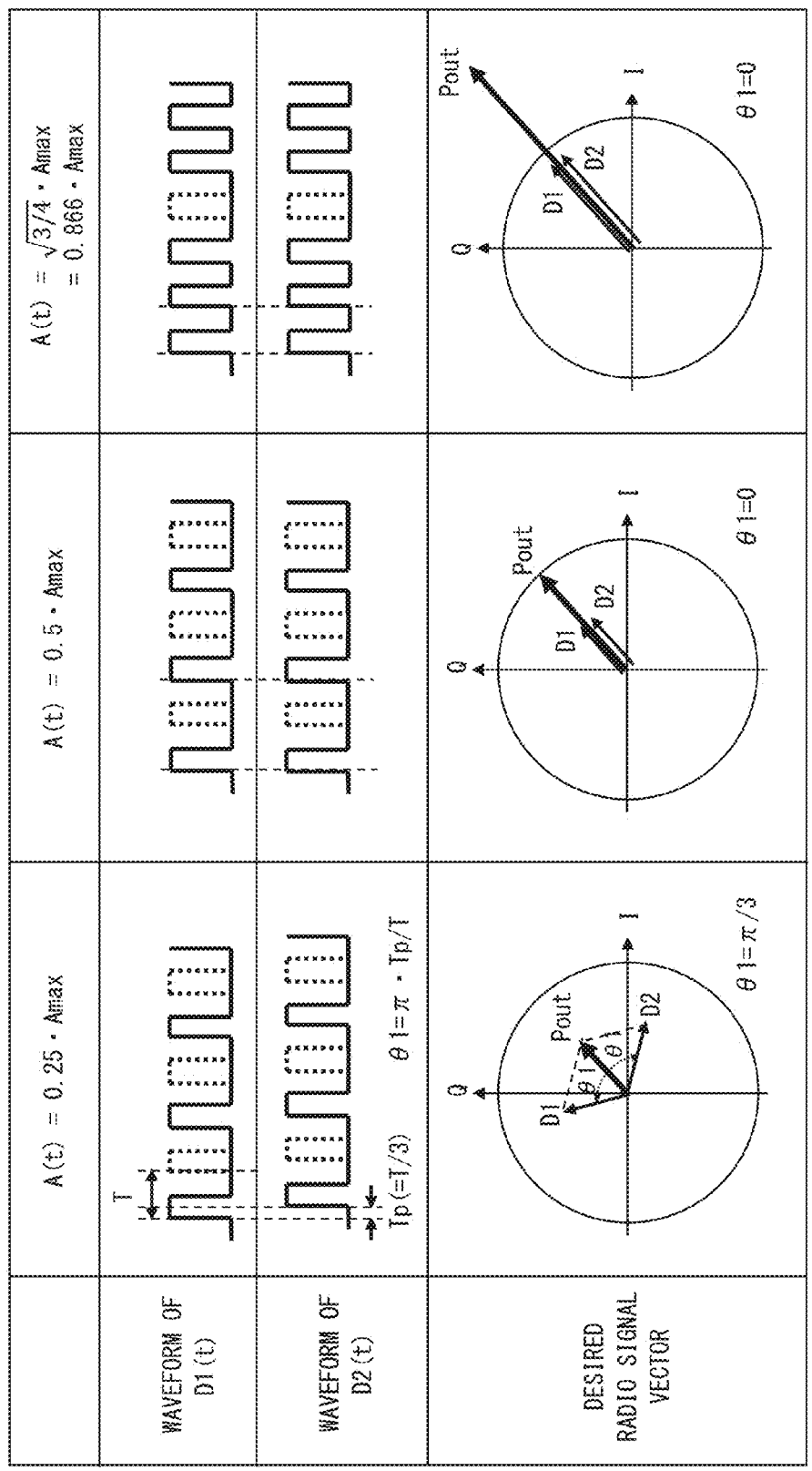
FIG. 4 is a table showing waveforms of output signals D1(t) and D2(t) and output vectors of a desired radio signal Pout contained in output signals Dout(t) in a case where a function 1 is used as a function f(A(t)) and a constant a is 0.5 (a=0.5)

FIG. 4 is a table showing waveforms of the output signals D1(*t*) and D2(*t*) of the individual digital transmission units 11 and 12, and output vectors of the desired radio signal Pout contained in the output signals Dout(t) of the digital transmitter 1 in a case where the function 1 is used as the function f(A(t)) and the constant a is 0.5 (a=0.5).

Firstly, when the amplitude signal A(t) is equal to or larger than 0.5·Amax (the middle and right columns in FIG. 4), the amplitude modulation amplitude signal A'(t) becomes equal to the amplitude signal A(t) and each of the amplitude modulation phase signals P1(t) and P2(t) becomes equal to the phase signal P(t) based on Expressions (11), (12) and (20). That is, each of the output signals D1(t) and D2(t) of the individual digital transmission units 11 and 12 becomes equal to the output signal of the transmitter 500 shown in FIG. 11. Therefore, in each of the output signals D1(t) and D2(t) of the individual digital transmission units 11 and 12, the pattern of the pulse waveform changes according to the amplitude. Specifically, as the amplitude decreases, the rate at which pulses are thinned out increases. Further, as the amplitude increases, the rate at which pulses are thinned out decreases. Note that as shown in FIG. 4, the amplitude value of the desired radio signal Pout contained in the output signal Dout(t) of the digital transmitter 1 corresponds to the norm of the vector sum of the vectors D1 and D2 of the desired radio signal contained in the output signals D1(t) and D2(t) of the individual digital transmission units 11 and 12. When the amplitude signal A(t) is equal to or larger than 0.5·Amax, the vectors D1 and D2 are equal to each other. Therefore, the amplitude value of the desired radio signal Pout is twice the norm of the vector D1 (or D2). Note that in this state, the norm of each of the vectors D1 and D2 is A'(t) and the angle difference $\theta1(t)$ between the vector D1 (or D2) and the desired radio signal Pout is zero.

Next, when the amplitude signal A(t) is smaller than 0.5·Amax (the left column in FIG. 4), the amplitude modulation amplitude signal A'(t) is fixed at 0.5·Amax irrespective of the value of the amplitude signal A(t). Further, the amplitude modulation phase signals P1(t) and P2(t) have phase differences of $\theta1(t)$ and $-\theta1(t)$, respectively, shown in Expression (21) with respect to the phase signal P(t). That is, in each of the output signals D1(t) and D2(t) of the individual digital transmission units 11 and 12, the pattern of the pulse waveform is fixed and only the phase changes. Note that as shown in FIG. 4, the amplitude value of the desired radio signal Pout contained in the output signal Dout(t) of the digital transmitter 1 is determined based on the angle difference (which is twice the phase difference signal $\theta1(t)$) between the vectors D1 and D2 of the desired radio signal contained in the output signals D1(t) and D2(t) of the individual digital transmission units 11 and 12. Specifically, as $\theta1(t)$ increases, the amplitude of the desired radio signal Pout decreases. Further, as $\theta1(t)$ decreases, the amplitude of the desired radio signal Pout increases.

Note that in the case where the function 1 is used as the function f(A(t)) and the constant a is 0.5 (a=0.5), when the amplitude signal A(t) is equal to or larger than 0.5·Amax, quantization noises occurring in the ΔΣ-modulators 1111 and 1211 are mixed into the output signal Dout(t). However, when the amplitude signal A(t) is smaller than 0.5·Amax, no quantization noise is mixed into the output signal Dout(t) because the amplitude value of the output signal Dout(t) is determined by $\theta1(t)$. Therefore, compared to the transmitter 500 shown in FIG. 11, the digital transmitter 1 shown in FIG. 2 can reduce the quantization noise contained in the output signal Dout(t) on average. This effect becomes remarkable especially when a radio signal whose amplitude signal widely changes over time (e.g., a radio signal in conformity with the LTE standards) is used. Note that the reduction in the quantization noise contained in the output signal Dout(t) means an improvement in the ACLR. That is, in the case where the function 1 is used as the function f(A(t)) and the constant a is 0.5 (a=0.5), the digital transmitter 1 shown in FIG. 2 can reduce the quantization noise and thereby satisfy the condition for the ACLR.

Figure 5:
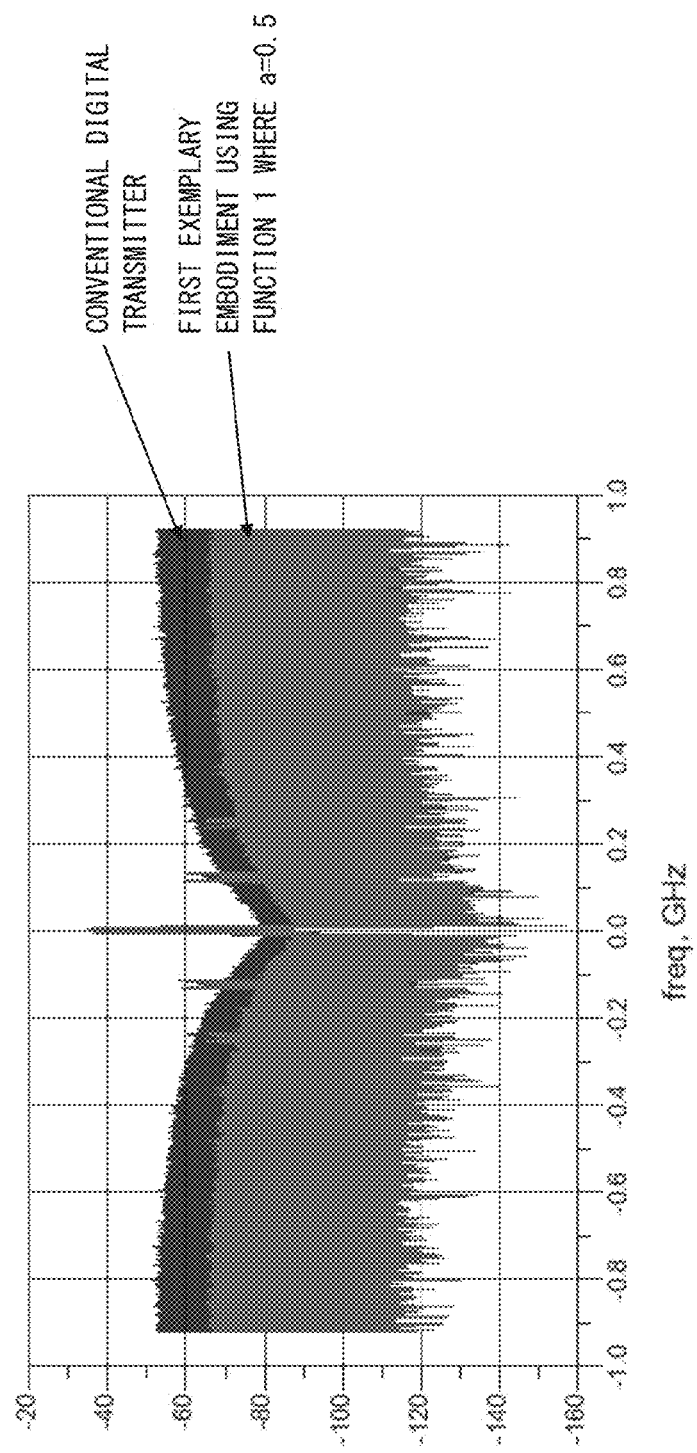
FIG. 5 shows a spectrum of an output signal Dout(t) in a case where a LTE-standard radio signal having a band of 20 MHz is used.

FIG. 5 shows a spectrum of the output signal Dout(t) in a case where a LTE-standard radio signal having a band of 20 MHz is used. Note that in the example shown in FIG. 5, the function 1 is used as the function f(A(t)) and the constant a is 0.5 (a=0.5). As shown in FIG. 5, it has been confirmed that the ACLR is improved by 8 dB with respect to a neighboring channel having an offset of 20 Mhz and improved by 8 dB with respect to a next neighboring channel (i.e., a channel next to the neighboring channel) having an offset of 40 Mhz.

Although this exemplary embodiment is explained by using an example case where the constant a in Expression (19) is 0.5, the present invention is not limited to such an example. The value of the constant a can be arbitrarily changed between 0 and 1. For example, as the value of the constant a is increased, the amplitude range where a quantization noise occurs becomes smaller. This means that the quantization noise contained in the output signal Dout(t) can be further reduced. However, in such a case, since the rate at which pulses are thinned out decreases on average, the switching loss in the switching operation by the D-class amplifiers 113 and 123 increases. This means that the transmission efficiency of the digital transmitter 1 deteriorates. On the other hand, as the value of the constant a is decreased, the amplitude range where a quantization noise occurs becomes larger. However, since the rate at which pulses are thinned out increases on average, the transmission efficiency of the digital transmitter 1 improves. That is, the transmission efficiency and the quantization noise of the digital transmitter 1 have a trade-off relation between them. By determining the constant a with consideration given to this trade-off relation, the digital transmitter 1 can improve the transmission efficiency and satisfy the condition for the ACLR.

As described above, when the function 1 is used as the function f(A(t)), the digital transmitter 1 according to this exemplary embodiment can satisfy the condition for the ACLR by reducing the quantization noise contained in the output signal Dout(t) on an average basis.

<Second Specific Example of Function f(A(t))>

Next, the effect of the digital transmitter 1 according to this exemplary embodiment in a case where a function 2 is used as a second specific example of the function f(A(t)) is explained. The function 2 is expressed by as the below-shown Expression (22).

[Expression 22]

$$f(A(t)) = A\max \text{ if } A(t) \geq a \cdot A\max = A(t)/a \text{ if } A(t) < a \cdot A\max \quad (22)$$

Note that Amax is the possible maximum value of the amplitude signal A(t) and a is an arbitrary constant between 0 and 1.

Then, the amplitude modulation amplitude signal A'(t) and the phase difference signal $\theta1(t)$ are expressed by below-shown Expression (23) or (24) depending on the case.

[Expression 23]

When $A(t) \geq a \cdot A\max$, $A'(t) = A\max$ $$\theta 1(t) = \cos^{-1}(A(t)/A\,\text{max}) \quad (23)$$

[Expression 24]

When $A(t) < a \cdot A\,\text{max}$, $$A'(t) = A(t)/a$$

$$\theta 1(t) = \cos^{-1}(a) \quad (24)$$

Figure 6A:
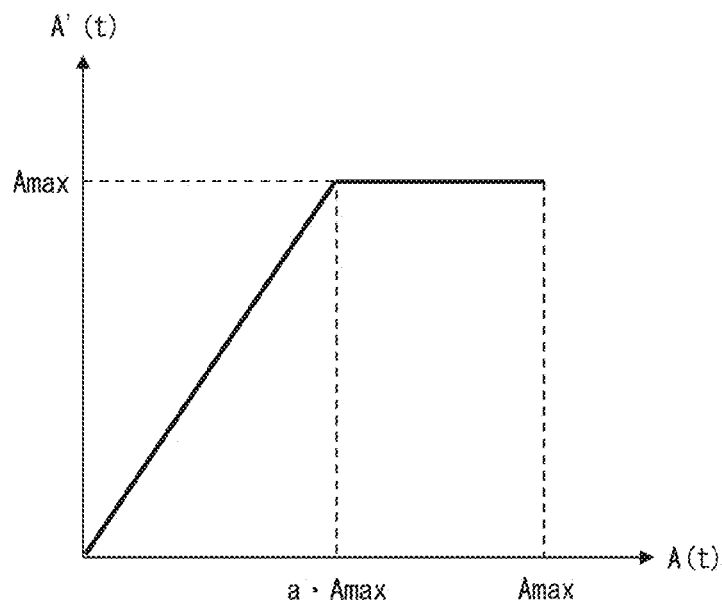
FIG. 6A shows a relation between an amplitude signal A(t) and an amplitude modulation amplitude signal A'(t)
Figure 6B:
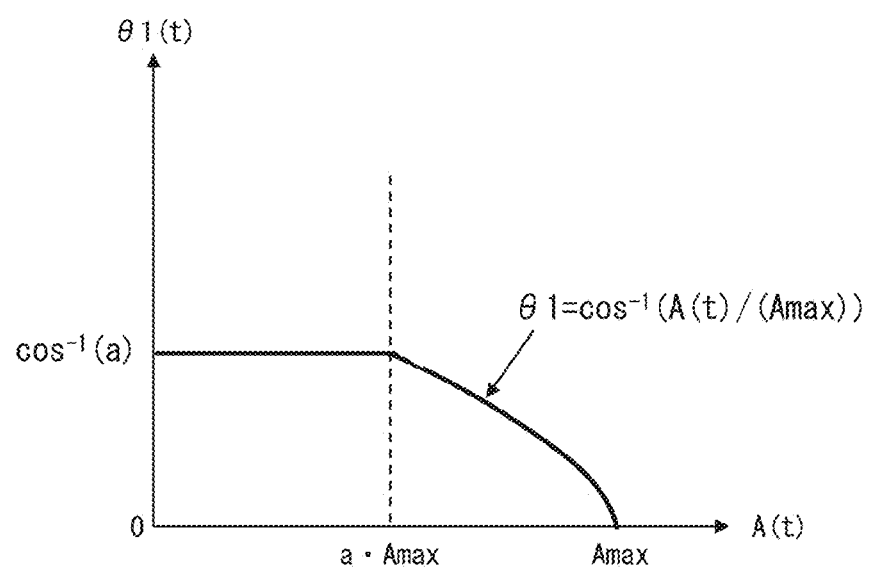
FIG. 6B shows a relation between an amplitude signal A(t) and a phase difference signal θ1(t)

The relations among the amplitude signal A(t), the amplitude modulation amplitude signal A'(t), and the phase difference signal θ1(t) are expressed as shown in FIGS. 6A and 6B based on Expressions (23) and (24). FIG. 6A is a graph showing a relation between the amplitude signal A(t) and the amplitude modulation amplitude signal A'(t). FIG. 6B is a graph showing a relation between the amplitude signal A(t) and the phase difference signal θ1(t).

Figure 7:
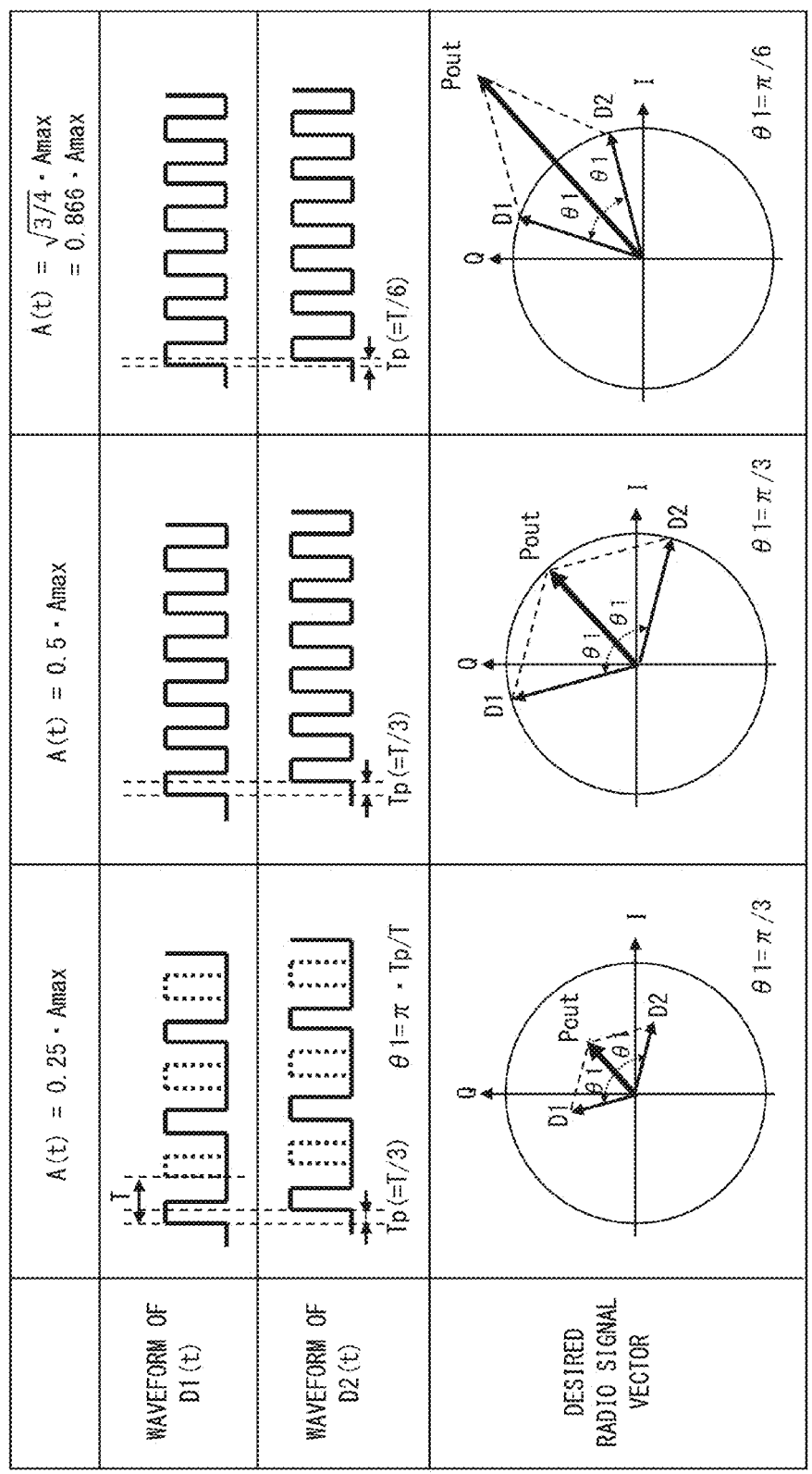
FIG. 7 is a table showing waveforms of output signals D1(t) and D2(t) and output vectors of desired radio signals Pout contained in output signals Dout(t) in a case where a function 2 is used as a function f(A(t)) and a constant a is 0.5 (a=0.5)

FIG. 7 is a table showing waveforms of the output signals D1(t) and D2(t) of the individual digital transmission units 11 and 12, and output vectors of the desired radio signal Pout contained in the output signals Dout(t) of the digital transmitter 1 in a case where the function 2 is used as the function f(A(t)) and the constant a is 0.5 (a=0.5).

Firstly, when the amplitude signal A(t) is equal to or larger than 0.5·Amax (the middle and right columns in FIG. 7), the amplitude modulation amplitude signal A'(t) is fixed at 0.5·Amax irrespective of the value of the amplitude signal A(t). Further, the amplitude modulation phase signals P1(t) and P2(t) have phase differences of θ1(t) and −θ1(t), respectively, shown in Expression (23) with respect to the phase signal P(t). That is, in each of the output signals D1(t) and D2(t) of the individual digital transmission units 11 and 12, the pattern of the pulse waveform is fixed and only the phase changes. Note that as shown in FIG. 7, the amplitude value of the desired radio signal Pout contained in the output signal Dout(t) of the digital transmitter 1 corresponds to the norm of the vector sum of the vectors D1 and D2 of the desired radio signal contained in the output signals D1(t) and D2(t) of the individual digital transmission units 11 and 12. Therefore, the amplitude value of the desired radio signal Pout is determined based on the angle difference between the vectors D1 and D2. Specifically, as θ1(t) increases, the amplitude of the desired radio signal Pout decreases. Further, as θ1(t) decreases, the amplitude of the desired radio signal Pout increases.

Next, when the amplitude signal A(t) is smaller than 0.5·Amax (the left column in FIG. 7), the amplitude modulation amplitude signal A'(t) becomes a scale signal of the amplitude signal A(t) obtained by dividing the amplitude signal A(t) by the constant a as shown in Expression (24). Further, the amplitude modulation phase signals P1(t) and P2(t) have fixed phase differences of π/3 and −π/3, respectively, with respect to the phase signal P(t). Therefore, in the output signals D1(t) and D2(t) of the individual digital transmission units 11 and 12, the pattern of the pulse waveform changes according to the amplitude. Specifically, as the amplitude decreases, the rate at which pulses are thinned out increases. Further, as the amplitude increases, the rate at which pulses are thinned out decreases. Note that as shown in FIG. 7, the amplitude value of the desired radio signal Pout contained in the output signal Dout(t) of the digital transmitter 1 corresponds to the norm of the vector sum of the vectors D1 and D2 of the desired radio signal contained in the output signals D1(t) and D2(t) of the individual digital transmission units 11 and 12. Therefore, when the amplitude signal A(t) is smaller than 0.5·Amax, the phase difference of the vectors D1 and D2 is constant.

Therefore, the amplitude value of the desired radio signal Pout is determined based on the norm of the vectors D1 and D2. Specifically, as the norm of the vectors D1 and D2 increases, the amplitude of the desired radio signal Pout increases. Further, as the norm of the vectors D1 and D2 decreases, the amplitude of the desired radio signal Pout decreases.

Note that in the case where the function 2 is used as the function f(A(t)) and the constant a is 0.5 (a=0.5), when the amplitude signal A(t) is smaller than 0.5·Amax, quantization noises occurring in the ΔΣ-modulators 1111 and 1211 are mixed into the output signal Dout(t). However, when the amplitude signal A(t) is equal to or larger than 0.5·Amax, no quantization noise is mixed into the output signal Dout(t) because the amplitude value of the output signal Dout(t) is determined by θ1(t). Therefore, compared to the transmitter 500 shown in FIG. 11, the digital transmitter 1 shown in FIG. 2 can reduce the quantization noise contained in the output signal Dout(t) on average. This effect becomes remarkable especially when a radio signal whose amplitude signal widely changes over time (e.g., a radio signal in conformity with the LTE standards) is used. Note that the reduction in the quantization noise contained in the output signal Dout(t) means an improvement in the ACLR. That is, in the case where the function 2 is used as the function f(A(t)) and the constant a is 0.5 (a=0.5), the digital transmitter 1 shown in FIG. 2 can reduce the quantization noise and thereby satisfy the condition for the ACLR.

Although this exemplary embodiment is explained by using an example case where the constant a in Expression (19) is 0.5, the present invention is not limited to such an example. The value of the constant a can be arbitrarily changed between 0 and 1. For example, as the value of the constant a is decreased, the amplitude range where a quantization noise occurs becomes smaller. This means that the quantization noise contained in the output signal Dout(t) can be further reduced. However, in such a case, since the rate at which pulses are thinned out decreases on average, the switching loss in the switching operation by the D-class amplifiers 113 and 123 increases. This means that the transmission efficiency of the digital transmitter 1 deteriorates. On the other hand, as the value of the constant a is increased, the amplitude range where a quantization noise occurs becomes larger. However, since the rate at which pulses are thinned out increases on average, the transmission efficiency of the digital transmitter 1 improves. That is, the transmission efficiency and the quantization noise of the digital transmitter 1 have a trade-off relation between them. By determining the constant a with consideration given to this trade-off relation, the digital transmitter 1 can improve the transmission efficiency and satisfy the condition for the ACLR.

As described above, when the function 2 is used as the function f(A(t)), the digital transmitter 1 according to this exemplary embodiment can satisfy the condition for the ACLR by reducing the quantization noise contained in the output signal Dout(t) on an average basis.

<Third Specific Example of Function f(A(t))>

Next, the effect of the digital transmitter 1 according to this exemplary embodiment in a case where a function 3 is used as a third specific example of the function f(A(t)) is explained. The function 3 is expressed by as the below-shown Expression (25).

[Expression 25]

$$f(A(t)) = A\,\text{max}^{1-n} \cdot A(t)^n \quad (25)$$

Note that Amax is the possible maximum value of the amplitude signal A(t) and n is an arbitrary value between 0 and 1.

Then, the amplitude modulation amplitude signal A'(t) and the phase difference signal θ1(t) are expressed by below-shown Expression (26).

[Expression 26]

$$A'(t) = A\max{}^{1-n} \cdot A(t)^n$$

$$\theta1(t) = \cos^{-1}((A(t)/A\max)^{1-n}) \tag{26}$$

Figure 8A:
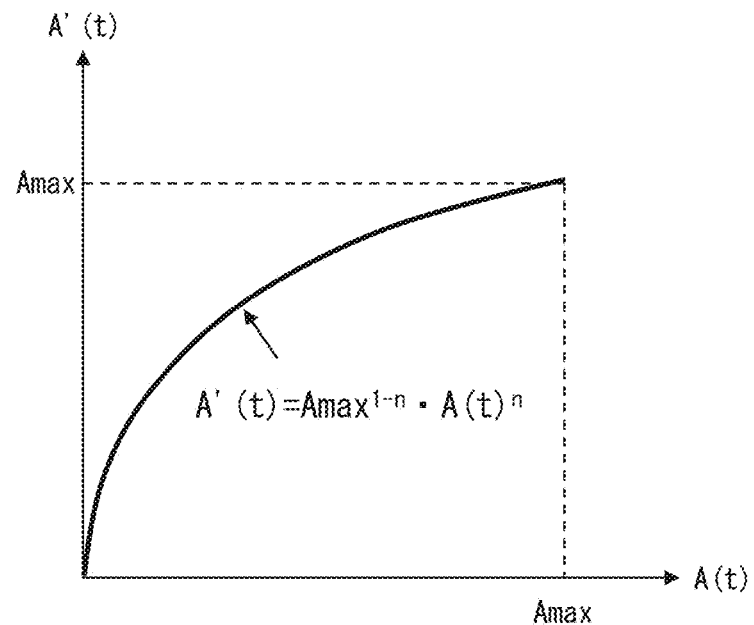
FIG. 8A shows a relation between an amplitude signal A(t) and an amplitude modulation amplitude signal A'(t)
Figure 8B:
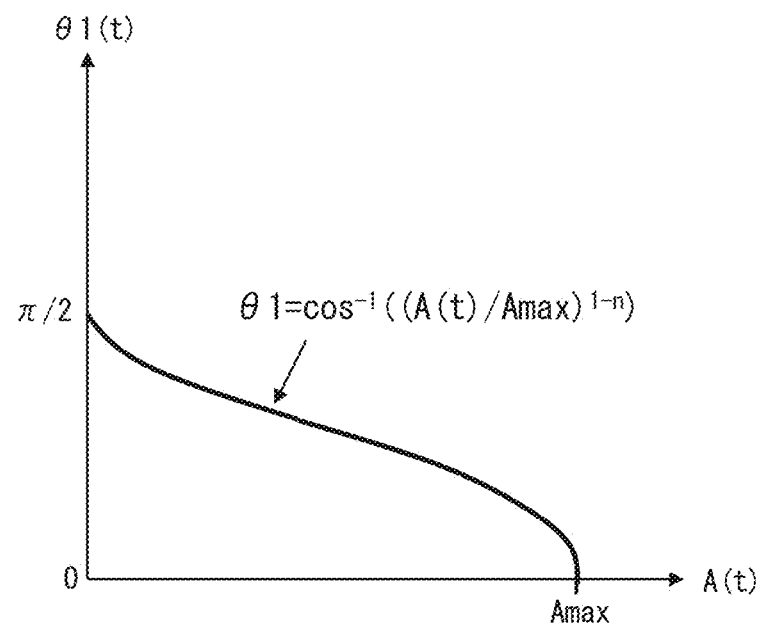
FIG. 8B shows a relation between an amplitude signal A(t) and a phase difference signal θ1(t)

The relations among the amplitude signal A(t), the amplitude modulation amplitude signal A'(t), and the phase difference signal θ1(t) are expressed as shown in FIGS. 8A and 8B based on Expression (26). FIG. 8A is a graph showing a relation between the amplitude signal A(t) and the amplitude modulation amplitude signal A'(t). FIG. 8B is a graph showing a relation between the amplitude signal A(t) and the phase difference signal θ1(t).

Figure 9:
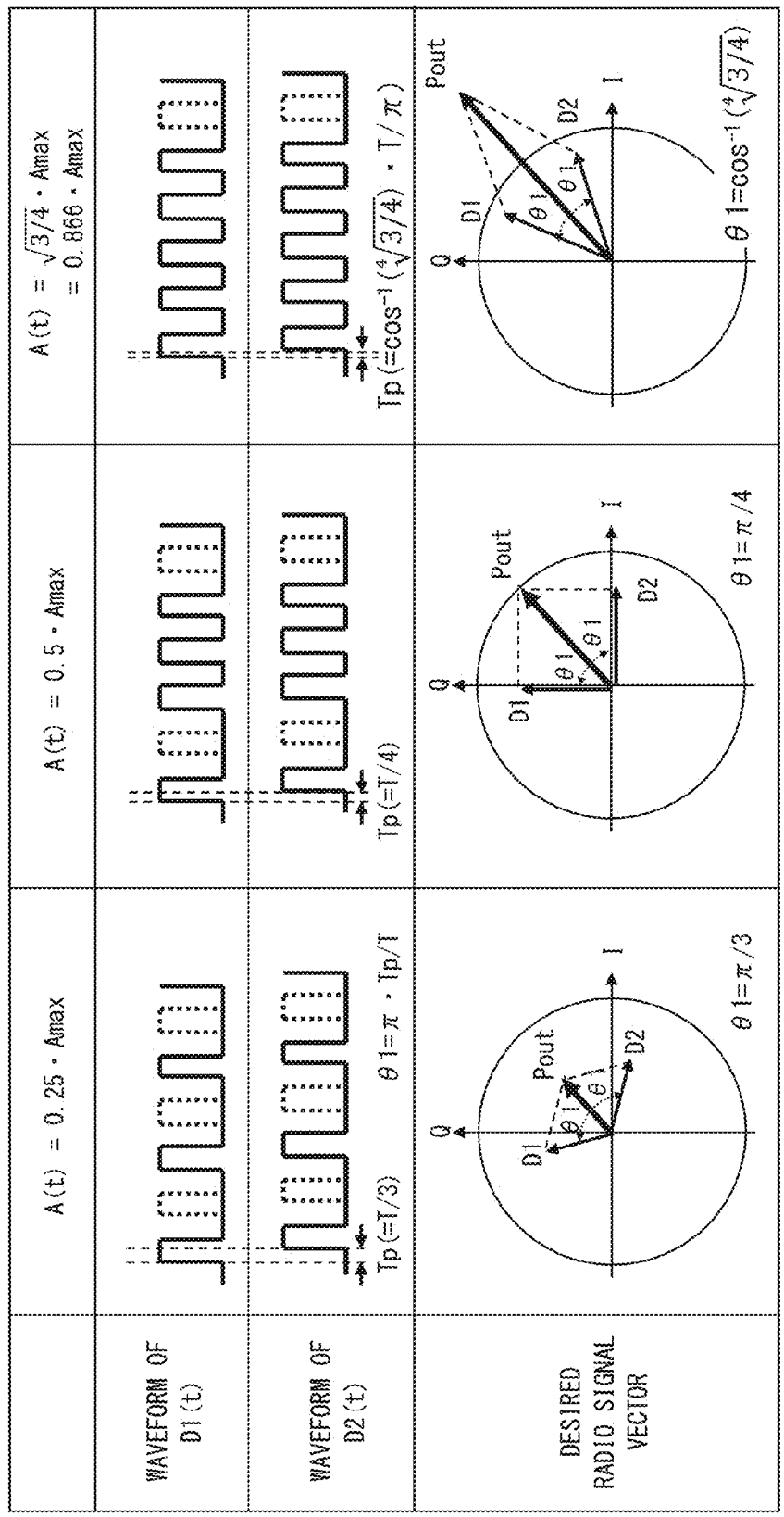
FIG. 9 is a table showing waveforms of output signals D1(t) and D2(t) and output vectors of desired radio signals Pout contained in output signals Dout(t) in a case where a function 2 is used as a function f(A(t)) and a value n is 0.5 (n=0.5)

FIG. 9 is a table showing waveforms of the output signals D1(t) and D2(t) of the individual digital transmission units 11 and 12, and output vectors of the desired radio signal Pout contained in the output signals Dout(t) of the digital transmitter 1 in a case where the function 3 is used as the function f(A(t)) and a value n is 0.5 (n=0.5).

In contrast to the cases where the functions 1 and 2 are used, when the function 3 is used as the function f(A(t)), the amplitude modulation amplitude signal A'(t) and the phase signal P(t) continuously change over the entire amplitude range. That is, the patterns of the pulse waveforms of the output signals D1(t) and D2(t) of the individual digital transmission units 11 and 12 change according to the value of the amplitude signal A(t), and the phase difference of the vectors D1 and D2 of the desired radio signal contained in the individual digital transmission units 11 and 12 also change. Note that as shown in FIG. 9, the amplitude value of the desired radio signal Pout contained in the output signal Dout(t) of the digital transmitter 1 corresponds to the norm of the vector sum of the vectors D1 and D2 of the desired radio signal contained in the output signals D1(t) and D2(t) of the individual digital transmission units 11 and 12. Therefore, the amplitude value of the desired radio signal Pout is determined based on both of the norm and the angle difference (phase difference) of the vectors D1 and D2.

When the function 3 is used as the function f(A(t)), quantization noises occurring in the ΔΣ-modulators 1111 and 1211 are mixed into the output signal Dout(t) over the entire amplitude range. However, since the output signal Dout(t) is also controlled by θ1(t) as well, the quantization noise mixed into the output signal Dout(t) is reduced compared to the related art. This effect becomes remarkable especially when a radio signal whose amplitude signal widely changes over time (e.g., a radio signal in conformity with the LTE standards) is used. Note that the reduction in the quantization noise contained in the output signal Dout(t) means an improvement in the ACLR. That is, in the case where the function 3 is used as the function f(A(t)) and the value n is 0.5 (a=0.5), the digital transmitter 1 shown in FIG. 2 can reduce the quantization noise and thereby satisfy the condition for the ACLR. Note that the value n is not limited to 0.5 and can be arbitrarily changed between 0 and 1.

As described above, when the function 3 is used as the function f(A(t)), the digital transmitter 1 according to this exemplary embodiment can reduce the quantization noise contained in the output signal Dout(t) and thereby satisfy the condition for the ACLR.

Figure 10:
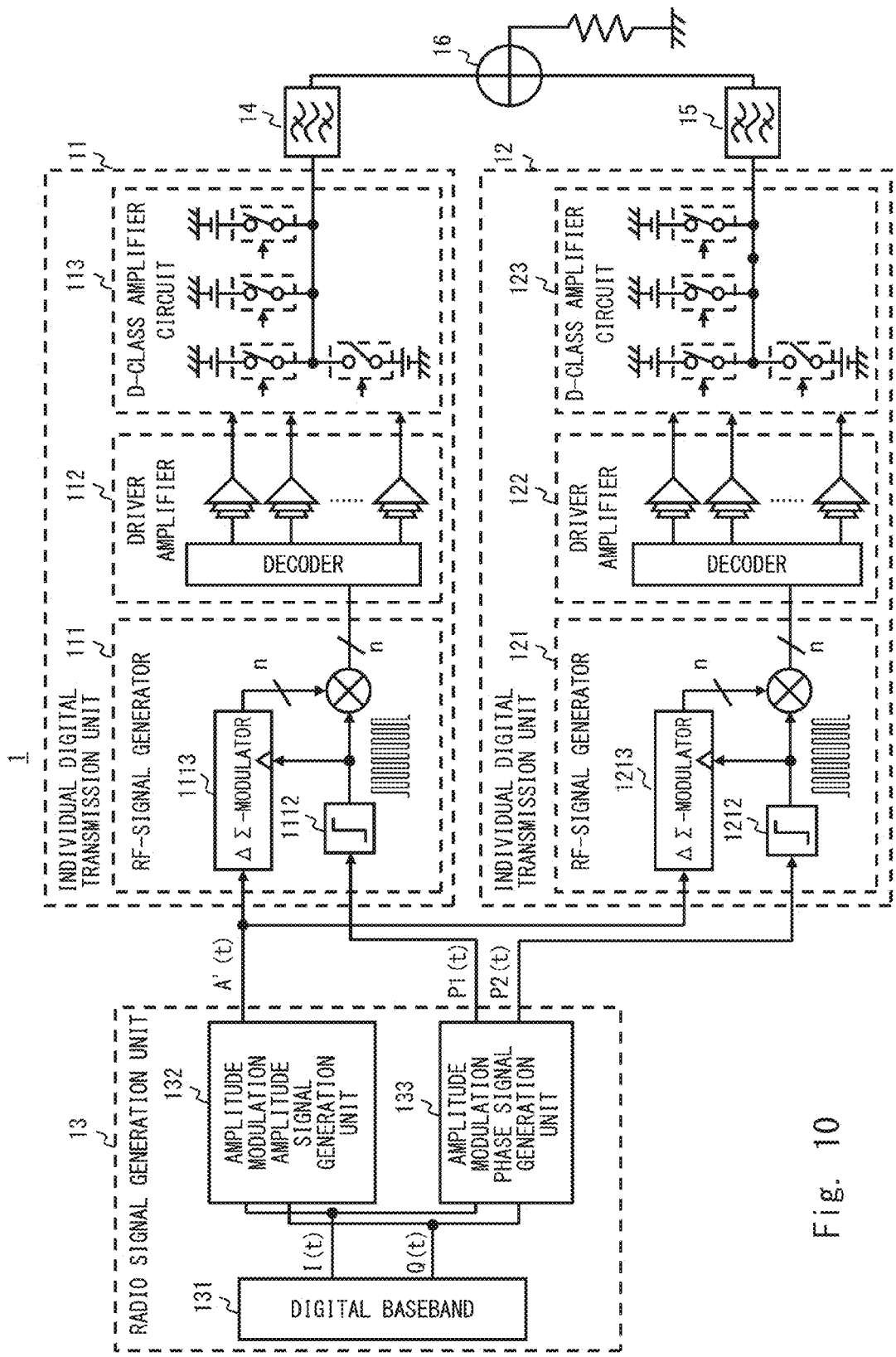
FIG. 10 is a block diagram showing a modified example of a digital transmitter according to the first exemplary embodiment.

Note that although this exemplary embodiment is explained by using an example case where each of the ΔΣ-modulators 1111 and 1211 and the D-class amplifiers 113 and 123 outputs a binary value, the present invention is not limited to such a configuration. As shown in FIG. 10, each of the ΔΣ-modulators 1111 and 1211 and the D-class amplifiers 113 and 123 may output a multi-valued value (or a multi-leveled value).

As described above, a digital transmitter 1 according to the above-described exemplary embodiment includes: an amplitude modulation amplitude signal generation unit that generates a function f(A(t)) of an amplitude signal A(t) as an amplitude modulation amplitude signal A'(t); an amplitude modulation phase signal generation unit that calculates an arc cosine value obtained by dividing the amplitude signal A(t) by the amplitude modulation amplitude signal A'(t) as a phase θ1(t) and generates amplitude modulation phase signals P1(t) and P2(t) having phases differences of the phase θ1(t) on positive and negative sides, respectively, from the phase signal P(t); a first individual digital transmission unit that generates an output signal D1(t) based on the amplitude modulation amplitude signal A'(t) and the amplitude modulation phase signal P1(t), the output signal D1(t) being an amplified RF-pulse signal; a second individual digital transmission unit that generates an output signal D2(t) based on the amplitude modulation amplitude signal A'(t) and the amplitude modulation phase signal P2(t), the output signal D2(t) being an amplified RF-pulse signal; and a synthesizing unit that combines the output signals D1(t) and D2(t) of the first and second individual digital transmission units and thereby generates an output signal Dout(t). As a result, the digital transmitter 1 according to the above-described exemplary embodiment can reduce the quantization noise contained in the output signal Dout(t) and thereby satisfy the condition for the ACLR.

Although the present invention is explained above with reference to exemplary embodiments, the present invention is not limited to the above-described exemplary embodiments. Various modifications that can be understood by those skilled in the art can be made to the configuration and details of the present invention within the scope of the invention.

This application is based upon and claims the benefit of priority from Japanese patent applications No. 2013-193075, filed on Sep. 18, 2013, the disclosure of which is incorporated herein in its entirety by reference.

REFERENCE SIGNS LIST

1 DIGITAL TRANSMITTER
11 INDIVIDUAL DIGITAL TRANSMISSION UNIT
12 INDIVIDUAL DIGITAL TRANSMISSION UNIT
13 RADIO SIGNAL GENERATION UNIT
14, 15 FILTER
16 RF-SYNTHESIZER
111 RF-SIGNAL GENERATOR
112 DRIVER AMPLIFIER
113 D-CLASS AMPLIFIER CIRCUIT
121 RF-SIGNAL GENERATOR
122 DRIVER AMPLIFIER
123 D-CLASS AMPLIFIER CIRCUIT
131 DIGITAL BASEBAND
132 AMPLITUDE MODULATION AMPLITUDE SIGNAL GENERATION UNIT
133 AMPLITUDE MODULATION PHASE SIGNAL GENERATION UNIT
500 TRANSMITTER

501 D-CLASS AMPLIFIER CIRCUIT
502 POWER SUPPLY
503a SWITCH ELEMENT
503b SWITCH ELEMENT
504 RF-SIGNAL GENERATOR
505 DRIVER AMPLIFIER
506 FILTER
507 DIGITAL BASEBAND
508 POLAR CONVERTER
509 ΔΣ-MODULATOR
510 COMPARATOR
511 MIXER
512, 513 DELAY DEVICE
514 QUANTIZER
515,516 ADDER/SUBTRACTER
1111, 1211 ΔΣ-MODULATOR
1112, 1212 COMPARATOR

The invention claimed is:

1. A transmitter comprising:
quadrature converter that performs a quadrature modulation on a digital signal and thereby outputs a quadrature radio signal;
amplitude modulation amplitude signal generation unit that generates a first predetermined function of an amplitude signal indicating an amplitude of the quadrature radio signal as an amplitude modulation amplitude signal;
amplitude modulation phase signal generation unit that calculates an inverse trigonometric function of a value according to the first predetermined function as a first phase and generates first and second amplitude modulation phase signals having phases shifted on positive and negative sides, respectively, by an amount corresponding to the first phase from a phase signal indicating a phase of the quadrature radio signal;
first pulse phase signal generator that generates a first pulse phase signal having a pulse waveform based on the first amplitude modulation phase signal;
first ΔΣ-modulator that performs a ΔΣ-modulation on the amplitude modulation amplitude signal in synchronization with the first pulse phase signal;
first mixer that generates a first radio frequency (RF) pulse signal by mixing an output signal of the first ΔΣ-modulator with the first pulse phase signal;
a first switching amplifier that amplifies the first RF-pulse signal;
second pulse phase signal generator that generates a second pulse phase signal having a pulse waveform based on the second amplitude modulation phase signal;
second ΔΣ-modulator that performs a ΔΣ-modulation on the amplitude modulation amplitude signal in synchronization with the second pulse phase signal;
second mixer that generates a second RF-pulse signal by mixing an output signal of the second ΔΣ-modulator with the second pulse phase signal;
a second switching amplifier that amplifies the second RF-pulse signal; and
synthesizer that combines outputs of the first and second switching amplifiers with each other.

2. The transmitter according to claim 1, wherein the amplitude modulation phase signal generation unit calculates an arc cosine value obtained by dividing the amplitude signal by the amplitude modulation amplitude signal as the first phase.

3. The transmitter according to claim 1, wherein the amplitude modulation amplitude signal generation unit generates the amplitude modulation amplitude signal having a constant value irrespective of the amplitude signal when the amplitude signal is within a predetermined range, and generates the amplitude modulation amplitude signal according to the amplitude signal when the amplitude signal is outside the predetermined range.

4. The transmitter according to claim 1, wherein the amplitude modulation amplitude signal generation unit:
generates, when the amplitude signal is smaller than a product of a possible maximum value of the amplitude signal and an arbitrary constant between 0 and 1, the product of the possible maximum value of the amplitude signal and the constant as the amplitude modulation amplitude signal, and
generates, when the amplitude signal is equal to or larger than the product of the possible maximum value of the amplitude signal and the constant, the amplitude signal as the amplitude modulation amplitude signal.

5. The transmitter according to claim 1, wherein the amplitude modulation amplitude signal generation unit:
generates, when the amplitude signal is smaller than a product of a possible maximum value of the amplitude signal and an arbitrary constant between 0 and 1, a value obtained by dividing the amplitude signal by the constant as the amplitude modulation amplitude signal, and
generates, when the amplitude signal is equal to or larger than the product of the possible maximum value of the amplitude signal and the constant, the possible maximum value of the amplitude signal as the amplitude modulation amplitude signal.

6. The transmitter according to claim 1, wherein the amplitude modulation amplitude signal generation unit generates a product of the $n_{th}$ power (n is an arbitrary value between 0 and 1) of the amplitude signal and the $(1-n)_{th}$ power of a possible maximum value of the amplitude signal as the amplitude modulation amplitude signal.

7. The transmitter according to claim 1, wherein
each of the first and second ΔΣ-modulator generates a multi-valued output signal,
the first mixer mixes the multi-valued output signal of the first ΔΣ-modulator with the first pulse phase signal and thereby generates a multi-valued first RF-pulse signal,
the second mixer mixes the multi-valued output signal of the second ΔΣ-modulator with the second pulse phase signal and thereby generates a multi-valued second RF-pulse signal,
the first switching amplifier amplifies the multi-valued first RF-pulse signal, and
the second switching amplifier amplifies the multi-valued second RF-pulse signal.

8. The transmitter according to claim 1, further comprising a band-pass filter disposed between the first and second amplifiers and the synthesizer.

9. The transmitter according to claim 1, further comprising a band-pass filter disposed behind the synthesizer.

10. A control method for a transmitter comprising:
performing a quadrature modulation on a digital signal and thereby outputting a quadrature radio signal;
generating a first predetermined function of an amplitude signal indicating an amplitude of the quadrature radio signal as an amplitude modulation amplitude signal;
calculating an inverse trigonometric function of a value according to the first predetermined function as a first phase and generating first and second amplitude modulation phase signals having phases shifted on positive and negative sides, respectively, by an amount corresponding to the first phase from a phase signal indicating a phase of the quadrature radio signal;
generating a first pulse phase signal having a pulse waveform based on the first amplitude modulation phase signal;
performing a first $\Delta\Sigma$-modulation on the amplitude modulation amplitude signal in synchronization with the first pulse phase signal;
generating a first radio frequency (RF) pulse signal by mixing a result of the first $\Delta\Sigma$-modulation with the first pulse phase signal;
amplifying the first RF-pulse signal by a first switching amplifier;
generating a second pulse phase signal having a pulse waveform based on the second amplitude modulation phase signal;
performing a second $\Delta\Sigma$-modulation on the amplitude modulation amplitude signal in synchronization with the second pulse phase signal;
generating a second RF-pulse signal by mixing a result of the second $\Delta\Sigma$-modulation with the second pulse phase signal;
amplifying the second RF-pulse signal by a second switching amplifier; and
combining outputs of the first and second switching amplifiers with each other.

* * * * *

UNITED STATES PATENT AND TRADEMARK OFFICE
CERTIFICATE OF CORRECTION

PATENT NO. : 9,548,880 B2
APPLICATION NO. : 15/022802
DATED : January 17, 2017
INVENTOR(S) : Shinichi Hori It is certified that error appears in the above-identified patent and that said Letters Patent is hereby corrected as shown below:

In the Drawings

Drawing Sheet 1, Fig. 1 (Reference Numeral 1113):
"1113" should be --1111--;

Drawing Sheet 1, Fig. 1 (Reference Numeral 1213):
"1213" should be --1211--;

Drawing Sheet 2, Fig. 2 (Reference Numeral 1113):
"1113" should be --1111--;

Drawing Sheet 2, Fig. 2 (Reference Numeral 1213):
"1213" should be --1211--;

Drawing Sheet 10, Fig. 10 (Reference Numeral 1113):
"1113" should be --1111--;

Drawing Sheet 10, Fig. 10 (Reference Numeral 1213):
"1213" should be --1211--.

In the Specification

Column 6, Line 31 (Expression 8):
"$W(t)A(t)+NH(t)$" should be --$W(t)=A(t)+NH(t)$--;

Column 8, Lines 26-27 (Expression 11):
"$P1(t)=(\cos^{-1}(P(t))+\theta1(t)$" should be --$P1(t)=\cos(\cos^{-1}(P(t))+\theta1(t))$--;

Column 17, Line 15:
"515,516" and insert --515, 516--.

Signed and Sealed this
Twenty-second Day of May, 2018

Andrei Iancu
*Director of the United States Patent and Trademark Office*